United States Patent [19]

Cherney

[11] Patent Number: 5,501,743
[45] Date of Patent: Mar. 26, 1996

[54] FIBER OPTIC POWER-GENERATING SYSTEM

[76] Inventor: Matthew Cherney, One Park La., Mount Vernon, N.Y. 10552

[21] Appl. No.: 289,285

[22] Filed: Aug. 11, 1994

[51] Int. Cl.⁶ ...................... H01L 31/052; H01L 31/058; F24J 2/00
[52] U.S. Cl. .......................... 136/248; 136/246; 126/699; 126/700; 126/675; 126/683
[58] Field of Search ..................... 136/246, 248; 126/684, 698–699, 663, 675, 683, 700

[56] References Cited

U.S. PATENT DOCUMENTS

| | | | |
|---|---|---|---|
| 3,780,722 | 12/1973 | Swet | 126/688 |
| 4,080,221 | 3/1978 | Manelas | 136/248 |
| 4,117,682 | 10/1978 | Smith | 60/641.8 |
| 4,236,937 | 12/1980 | Wihl | 136/246 |
| 4,529,830 | 7/1985 | Daniel | 136/246 |
| 5,089,055 | 2/1992 | Nakamura | 136/248 |

FOREIGN PATENT DOCUMENTS

| | | | |
|---|---|---|---|
| 61-231773 | 10/1986 | Japan | 136/246 |
| 2-158500 | 6/1990 | Japan | 136/246 |

*Primary Examiner*—Aaron Weisstuch
*Attorney, Agent, or Firm*—Herbert Dubno

[57] ABSTRACT

A fiber optical solar power generating system provides a tower outside a structure to be supplied with solar energy and on which a multiplicity of collectors are provided. An optical fiber trunk carries the collected optical energy to the structure in which a photovoltaic and/or a light/heat transducing stack can be provided and to which light is distributed from the optical fiber trunk so that the transducers need not occupy large areas of the property.

11 Claims, 3 Drawing Sheets

FIBER OPTIC POWER-GENERATING SYSTEM

FIELD OF THE INVENTION

The present invention relates to a fiber optic power-generating system and more particularly to an improved alternative energy source for structures utilizing optical fiber energy transmission.

BACKGROUND OF THE INVENTION

Increasing concern with fossil fuel as an energy source and concern with the safety of nuclear power has led to interest in the development of alternative energy sources such as solar power.

One of the major problems with solar power is the large area required for photovoltaic converters and even thermal solar energy converters when these must be directly positioned in the path of the solar radiation.

Although photovoltaic efficiency has been increasing in recent years, even with the augmented efficiency, direct impingement of solar rays upon photovoltaic plates requires that the installation cover large areas which may not be readily available, especially for the average household.

Furthermore, efforts to overcome this problem by the use of light concentrators or the like have not always proved to be effective. Reference may be had, for example, to U.S. Pat. No. 5,195,503 which discloses a relatively complex system intended to maximize the solar collection of heat from the sun with automatic tracking of the path of the sun.

Efforts have also been made to increase the energy output by passing a compressed gas through a solar collector (U.S. Pat. No. 4,942,736) or to provide tower systems which convey a vapor to a high point at which the vapor is condensed to a liquid and the falling liquid will drive a turbine (see U.S. Pat. No. 4,757,687). Other solar collectors of interest are described in U.S. Pat. Nos. 4,117,682, 4,236,937, 4,676,068, 4,558,551, 4,392,008, 4,219,729, 4,720,170 and 3,996,918.

These systems do not solve the main problems discussed above with respect to the large areas required, the complexity of the systems, and the ability to install an effective solar energy system in, for example, a residence or similar structure.

OBJECTS OF THE INVENTION

It is, therefore, the principal object of the present invention to provide an improved solar energy collection and utilization system whereby drawbacks of earlier systems are avoided, the spacial requirements are greatly reduced and the portion of the apparatus which must be contained in the structure to be supplied with the energy is extremely compact.

Another object of the invention is to provide a low-cost high-efficiency system which is not limited by the need to cover large areas of the property with solar collectors or photovoltaic sheets and which nevertheless can generate useable electrical energy and heat at high efficiency.

SUMMARY OF THE INVENTION

I have discovered that these objects are readily attainable, utilizing either photovoltaic (semiconductor) plates or photothermal transducers, by providing the transducers in stacks with the light energy being transmitted to them by distributor plates forming part of the stack and juxtaposed with the photovoltaic or photothermal plates, the light energy being delivered to the distributors by optical fibers.

Preferably the light is collected by an external tower structure supplied with a multiplicity of collectors, especially lenses or lens systems from which the optical energy is delivered to the building via an optical fiber trunk which terminates at one or both of the stacks described.

More particularly, a fiber optic power-generating system can comprise:

- a tower positioned outside and apart from a structure to be supplied with power;
- a multiplicity of solar-light collectors on the tower over at least part of the height of the tower and around the periphery thereof;
- respective optical fibers assigned to the collectors and transmitting light therefrom, the optical fibers being formed into an optical fiber trunk extending from the tower into the structure; and
- within the structure a stack of energy transducing plates each receiving at least one optical fiber from the trunk and provided with means for distributing light delivered by an optical fiber over the respective plate for producing energy utilized at least in part within the structure.

The invention also is a fiber optic system which comprises:

- a stack of photovoltaic plates;
- respective light distributors juxtaposed with each of the plates, the light distributors being sandwiched between pairs of photovoltaic plates of the stack; and
- respective light-delivering optical fibers connected to each of the light distributors for supplying light thereto.

It will be apparent that the stacking arrangement of the photovoltaic panels allows for a high panel surface area and therefore high electrical productivity in a small volume.

Since the stack is contained in the structure or building, the photovoltaic panels are not exposed to weather or physical stress and therefore can be fabricated at lower cost. The fiber optic main cable can be branched to distribute the light to the mirror line panel stacks and can receive the light from relatively inexpensive sources like mirrors or lenses. The fact that such mirrors or lenses can be distributed, e.g. on the tower or at each collector can eliminate potential problems with overheating. When built to scale, the fiberoptic cables may be as wide as (and similar to) polyarylate curtain rods. The stacks may be moved closer to the collectors so that the fiberoptic distance is minimal, with metal wire covering the remaining distance to the main structure.

According to a feature of the invention, the plates can be electrically connected in series and tied to a storage system, e.g. one or more batteries, which, in turn, supply an inverter for producing alternating current for the building or to a capacitance-regulation system. The means for distributing the light can be brush plates of optical fiber bristles or light-conductive plates (e.g. of a polyacrylate) provided with diffuse surfaces facing the respective photovoltaic plates.

The collectors may have a mushroom shape upon which arrays of lenses are provided and the mushroom-shaped collectors may themselves be stackable by having the stem of one collector fit into the convex body of another. Hexagonal convex lenses in the shape of a honeycomb make an efficient collection system.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
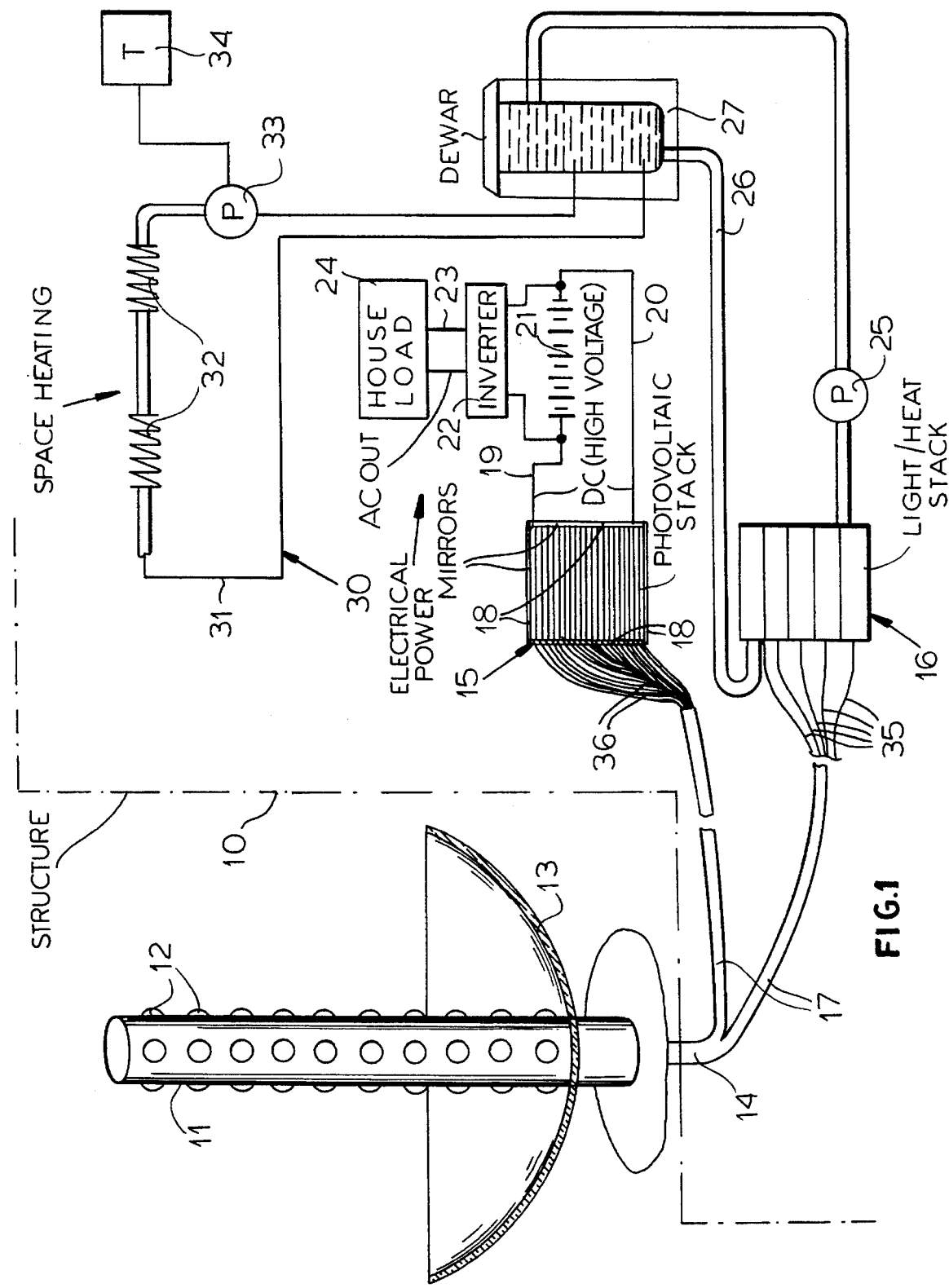
FIG. 1 is a diagram, partly in section, showing the principles of a fiber optic power-generating system according to the invention.

As will be apparent from FIG. 1, the delivery of energy to a structure 10, e.g. a residence such as a single or multi-family home, can utilize a tower 11 provided with an array of collecting elements 12, here shown to be collecting lenses, peripherally and over the height of the tower. While the tower has been shown as a simple cylindrical column in the drawing for illustrative purposes only, it will be understood that it may have any other convenient configuration occupying as little space as possible and may be as tall as is necessary to collect the requisite amount of energy to service the facility. Of course, the tower should be located outside the structure and out of the shadow thereof and may, if desired, be located atop the structure, alongside it or even remote from the structure if advantageous.

If desired, the tower may be provided with one or more reflectors, as represented by the parabolic reflector 13 to reflect solar energy onto the collectors. The reflectors need not be part of the tower.

From the tower, an optical fiber trunk 14 runs to the structure 10 and may be a single large diameter optical fiber or a bundle of optical fibers.

The optical fiber trunk can deliver energy to an electrical-generating stack 15 or to a heat-generating stack 16 or, where the optical fiber trunk is split at 17, to both the electricity-generating stack and the heat-generating stack. The division of the optical fiber trunk at 17 may be in proportion to the amount of electrical and thermal energy required.

The stack 15 comprises a stack of photovoltaic plates alternating with light-distributing plates as will be described in greater detail hereinafter and can be surrounded by mirrors 18 so as to minimize light losses from the stack. The photovoltaic plates of the stack 15 may be connected in series so that a high voltage is outputted from the stack at the DC terminals 19 and 20 across which a battery 21 is connected as an energy-storage source.

Since household current is normally alternating current, an inverter 22 is connected across the battery to output at 23 the alternating current to the household load 24, namely, the outlets, lights, and other electrically driven household equipment and appliances.

The photothermal stack 16 converts light to heat and the heat is abstracted by circulating a liquid through the stack 16 via a pump 25. The heat-abstracting liquid circulation is represented at 26 and can include a Dewar vessel 27 which, because of the vacuum insulation characteristic of a Dewar vessel, has low thermal loss. The heat abstracting liquid may be water. As represented at 30, a space-heating loop 31 with space-heating converters 32 may be connected to the liquid-storage vessel 27 and provided with a pump 33 for the heating of the structure. A thermostat 34 can control the pump 33. The space-heating unit 30 represents utilization in the structure 10 of the thermal energy obtained from the light supplied by the optical fibers 35 of the portion of the trunk 14 supplying the stack 16. Of course other applications, such as feeding the light to seedling-filled drawers for agricultural purposes is also within the scope of this invention. The optical fibers 36 of the other portion of the trunk, of course, are connected to light distributors of the photovoltaic stack.

From FIG. 1 it will be immediately apparent that a large overall photovoltaic area can be utilized in a small volume and without covering large areas of the property with solar collectors.

Figure 2:
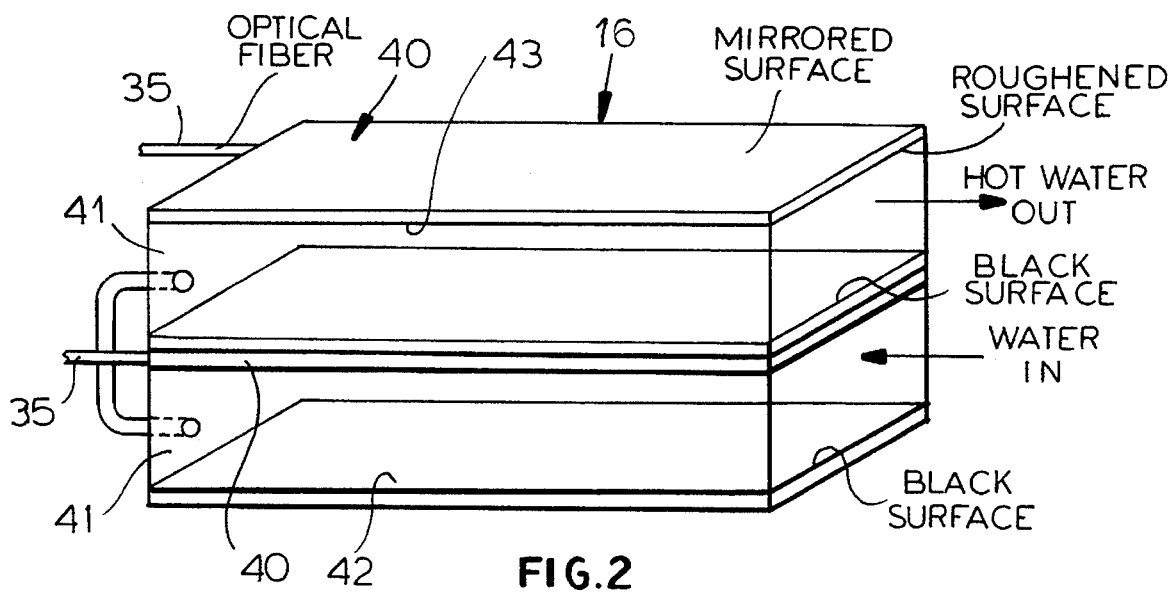
FIG. 2 is a diagrammatic perspective view showing a detail of the heat-generating unit of that system.
Figure 4:
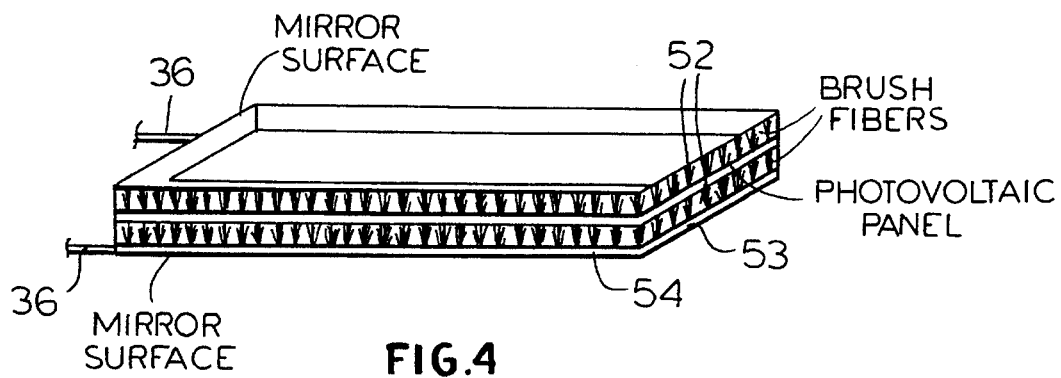
FIG. 4 is a perspective view showing the use of brush plates as light distributors according to the invention.

In FIG. 2 I have shown a portion of the light/heat transducing stack 16. This stack is shown to consist of light distributors 40 which cooperate with chambers 41 traversed by the water to be heated. Each of the chambers 41 has a blackened heat-absorbing surface 42 upon which the light impinges and which raises in a temperature as a function of the amount of light energy supplied. The distributors 40 are supplied with light by the optical fibers 35 and have roughened or diffuse surfaces 43 at which light is emitted and reflective surfaces or mirrored surfaces 44 directing the light toward the respective chamber. Brush-like distributors as will be described in connection with FIG. 4 may also be used.

It will be appreciated that water circulated through the stack will be heated by the thermal energy produced from the distributed light supplied by the optical fibers 35.

Figure 3:
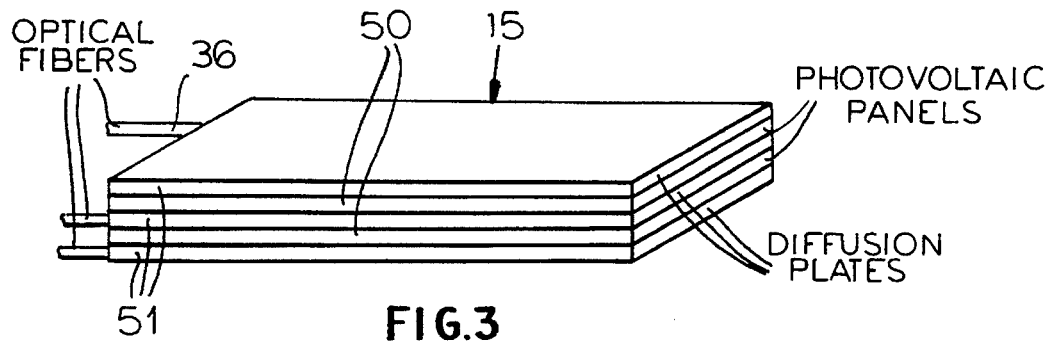
FIG. 3 is a detail of the photovoltaic stack according to one embodiment of the invention.

As can be seen from FIG. 3, where a portion of the stack 15 is shown, photovoltaic panels 50 sandwich diffusion plates 51 between them and, in turn, are sandwiched between light diffusion plates which may have the same construction as the distributors 40 of FIG. 2 but are here supplied by the optical fibers 36.

Optical distributors (see FIG. 4) in the form of brushes 52 of optical fibers connected to a light-transmitting support 53 and provided with a mirror surface 54 opposite the brush fiber can alternatively be supplied by the optical fibers 36 to distribute light over the areas of the optical fiber. In either case, the photovoltaic plates receive the optical energy from light distributors over their entire areas and generate electrical energy in the manner described.

Figure 5:
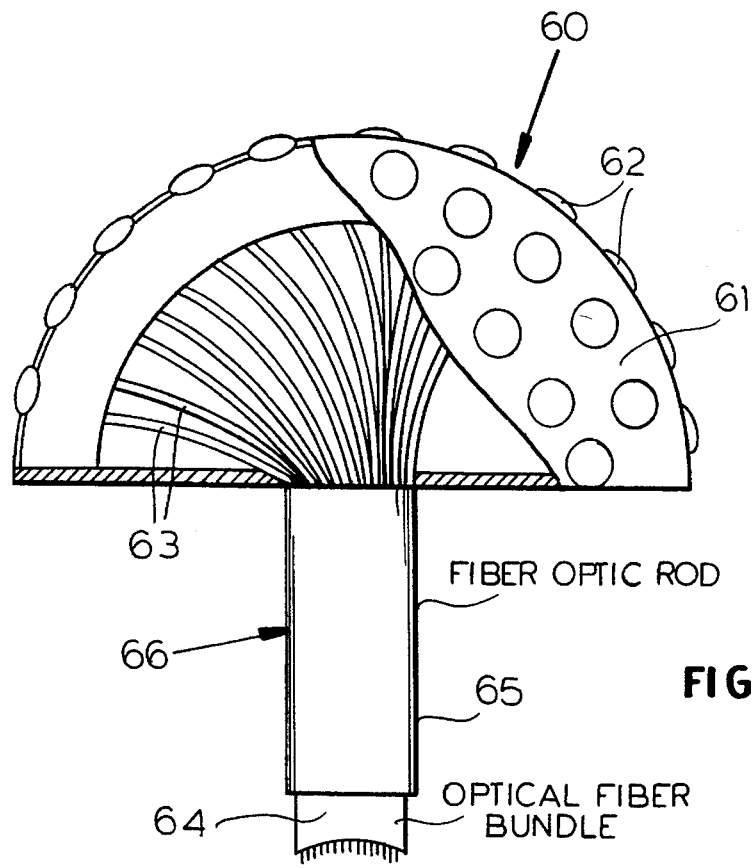
FIG. 5 is an elevational view partly broken away of a mushroom-shaped collector according to the invention.
Figure 6:
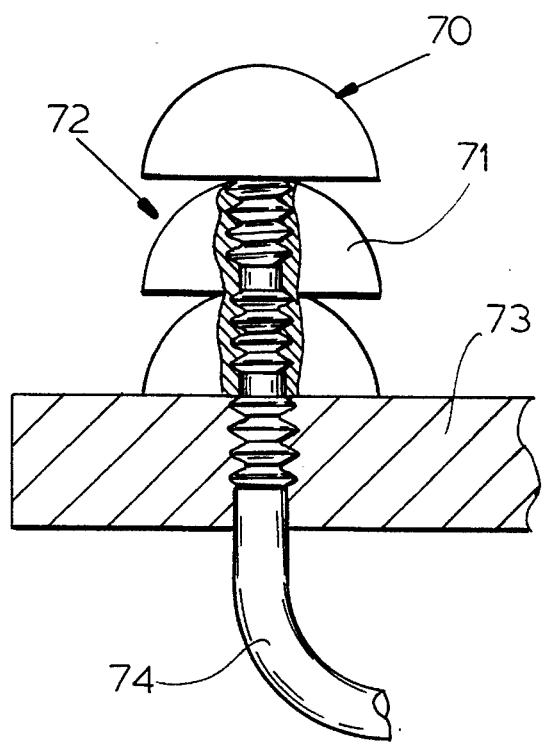
FIG. 6 is an elevational view partly in section showing stacking of mushroom-shaped collectors.

Instead of lenses 12 at the tower 11, the collectors (see FIG. 5) may be formed as mushroom-shaped elements 60 which have generally spherical convex body portions 61 on which collecting lenses 62 are mounted, these lenses being focused on the ends of optical fibers 63 running to a trunk 64 in the form of an optical fiber bundle or a fiber optical rod 65 to which the optical fiber bundle 64 is connected. The stem 66 of the mushroom-shaped element can be mounted directly in the tower or the stem of one mushroom-shaped collector 70 can be threaded into the body 71 of another to create a stack 72 of the mushroom-shaped collectors here shown on a plate 73 forming part of a tower and which can be provided with a multiplicity of such stacks in spaced-apart relationship. Optical fiber trunk or bundle 74 from each stack may run together with other bundles or fibers to form still a larger trunk which can enter the structure.

I claim:

1. A fiber-optic power generating system, comprising:

an elongated tower positioned apart from a structure to be supplied with power;

a multiplicity of circularly shaped solar-light collectors on said tower spaced apart over the height of the tower and around the periphery thereof;

respective optical fibers assigned to said collectors and transmitting light therefrom, said optical fibers being formed into an optical fiber trunk extending from said tower into said structure; and within said structure a stack of energy transducing plates each receiving at least one optical fiber from said trunk and provided with means for distributing light delivered by an optical fiber over the respective plate for producing energy utilized at least in part within said structure, said stack being a stack of photovoltaic plates generating electrical energy, at least some of said plates being electrically connected in series, and an optically conductive plate juxtaposed with each photovoltaic plate and having a light diffusion surface facing the respective photovoltaic plate, said optical fibers terminating at an edge of each of said optically conductive plates.

2. The fiber-optic power generating system defined in claim 1, further comprising storage means connected to said stack for storing electrical energy produced thereby.

3. The fiber-optic power generating system defined in claim 2, further comprising an inverter connected to said storage means for produce alternating current for electrically supplying said structure.

4. The fiber-optic power generating system defined in claim 1 wherein said stack is a stack of chambered plates each having means for converting incident light to heat and means for circulating a fluid to be heated therethrough.

5. The fiber-optic power generating system defined in claim 1 wherein each of said collectors includes a lens.

6. The fiber-optic power generating system defined in claim 1, further comprising reflector means at said tower for reflecting solar energy on to at least one of said collectors.

7. The fiber-optic power generating system defined in claim 1 wherein at least one of said collectors has a generally mushroom shape with a spherically convex portion and a stem extending from said spherically convex portion.

8. The fiber-optic power generating system defined in claim 7 wherein said spherically convex portion is provided with an array of lenses focussed inward, and within said spherically convex portion at least one optical fiber element receiving light from a respective lens and conducting light along said stem.

9. The fiber-optic power generating system defined in claim 7 wherein a stem of one mushroom-shaped collector fits into a spherically convex portion of another mushroom-shaped collector to form a stack of said collectors.

10. A photovoltaic system which comprises:

a stack of photovoltaic plates;

respective light distributors juxtaposed with each of said plates, said light distributors being sandwiched between pairs of photovoltaic plates of the stack; and respective light-delivering optical fibers connected to each of said light distributors for supplying light thereto, each of said light distributors including a brush plate of optical fiber bristles juxtaposed with each photovoltaic plate.

11. A fiber optic power generating system which comprises:

solar-light collecting means disposed apart from a structure to which power is to be supplied and formed with a multiplicity of individual mutually spaced solar collectors at least some of which are turned toward the sun;

respective optical conductors assigned to said collectors for conducting light therefrom, said optical conductors forming an optical conductor trunk running from said solar light collecting means into said structure;

a stack of energy transducing plates in said structure, each terminating one of said conductors for distributing light therefrom, said plates being spaced apart in said stack to define liquid flow chambers therebetween, said chambers having blackened and roughened walls for facilitating transfer of thermal energy from said plates to a heat-transfer liquid; and means in said structure for circulating said liquid through said stack, thereby extracting heat from said stack.

* * * * *